United States Patent [19]

Villa et al.

[11] Patent Number: 4,682,197

[45] Date of Patent: Jul. 21, 1987

[54] POWER TRANSISTOR WITH SPACED SUBTRANSISTORS HAVING INDIVIDUAL COLLECTORS

[75] Inventors: Flavio Villa, Milan; Bruno Murari, Monza; Franco Bertotti, Milan; Aldo Torazzina, Monza; Fabrizio Stefani, Cardano al Campo, all of Italy

[73] Assignee: SGS Microelettronica S.p.A., Catania, Italy

[21] Appl. No.: 812,109

[22] Filed: Dec. 23, 1985

[30] Foreign Application Priority Data

Jan. 8, 1985 [IT] Italy ............................ 19050 A/85

[51] Int. Cl.$^4$ ............... H01L 29/72; H01L 23/52; H01L 27/10; H01L 29/08
[52] U.S. Cl. ............................. 357/36; 357/28; 357/44; 357/46
[58] Field of Search ............... 357/28, 36, 44, 46

[56] References Cited

U.S. PATENT DOCUMENTS 4,012,764 3/1977 Satonaka ..................... 357/46
4,276,516 6/1981 Congdon ..................... 357/28
4,371,792 2/1983 Dobkin ......................... 357/46

FOREIGN PATENT DOCUMENTS 2133619 7/1984 United Kingdom ............ 357/46

OTHER PUBLICATIONS

Solid State Electronics, 1977, vol. 20, p. 635 Bosch "Anomalous Current Distributions in Power Transistors".

Primary Examiner—William D. Larkins
Assistant Examiner—John Lamont
Attorney, Agent, or Firm—Guido Modiano; Albert Josif

[57] ABSTRACT

This integrated semiconductor device aims at drastic reduction of the direct secondary breakdown phenomena and has a plurality of side-by-side elementary transistors forming an interdigited structure. To reduce the thermal interaction between the elementary transistors, the latter are spaced apart from one another by a distance approximately equal to the width of one elementary transistor and are driven by current sources. Spacing apart reduces electrothermal interaction. Further, in order to minimize the device area requirements, the space between any two adjacent elementary transistors is made to accommodate drive transistors operating as current sources, or the elementary transistors of the complementary stage where the device forms a class B output stage, the two output transistors whereof are alternatively switched on.

8 Claims, 8 Drawing Figures

POWER TRANSISTOR WITH SPACED SUBTRANSISTORS HAVING INDIVIDUAL COLLECTORS

BACKGROUND OF THE INVENTION

This invention relates to an integrated semiconductor device. More particularly, the invention relates both to an integrated bipolar power transistor and a class B output stage.

As is known, it is common practice with integrated power transistors to divide the emitter area into plural regions and accommodate the latter in the base areas, as suitably subdivided to obtain high output currents. Of course, the collector regions extend parallel to one another and are separated from one another by an area including the base area and emitter area, thus forming elementary transistors which extend adjacently to one another. In practice, interleaved emitter and collector contact areas are obtained which form, therefore, a typical geometry called "interdigited geometry".

As for the class B output stages, this geometry is repeated for each of the two power transistors making up the stage, so as to obtain two such interdigited structures, generally disposed adjacent to each other.

Structures of this kind afford a definitely improvement in high current gain over other structures, but are affected by the problem of the direct secondary breakdown ($I_{s/b}$).

As is known, the direct secondary breakdown is the main cause for failure of power transistors and is due to voltage disuniformity on the junctions and to temperature disuniformity in the different areas of the transistor (see the article "La rottura secondaria nei circuiti integrati di potenza" by F. Villa, Elettronica e telecomunicazioni, No. 3, 1984).

In particular, the main obstacle to the achievement of better direct secondary breakdown strength concerns the electrothermal interaction between the different power dissipating areas of the transistors.

Several solutions have been proposed already for improving the direct secondary breakdown strength of transistors. In particular a solution consists of utilizing resistors, called ballast resistors, in series with the emitter of each elementary transistor to introduce a negative feedback which stabilizes its behavior.

Another known solution (see English Pat. No. 1 467 612) consists of replacing each elementary transistor, e.g. of the NPN type, with a pair of NPN transistors of one of which forms the drive transistor and the other forms the output transistor, cascode connected to each other or in the Darlington configuration and being disposed geometrically such that the output transistor is coupled thermally with the drive transistor of another pair instead of with that of its own pair so as to obtain compensation for the thermal unbalances.

A definitely more substantial improvement is achieved with the solution indicated in Italian patent application No. 21028 A/84 by this same assignee. According to that solution, the bases of the elementary transistors forming the power transistor or every power transistor in the output stage, instead of being shorted together, are independent of one another and each of them is controlled by means of a respective current source, constructed with a PNP type bipolar transistor the connector whereof is connected to the aforesaid bases. This may be accomplished without any wasted area by subdividing the collector of the PNP drive transistor of the near complementary symmetry output stage and thus forming a multi-collector PNP structure. That structure is shown in FIGS. 1 and 2 for an integrated bipolar power transistor, and in FIG. 6 for a class B output stage.

By virtue of the solution known from the cited application, those regenerative phenomena of the electrothermal type which arise in a traditional power structure are decreased in that the collector current variations of each elementary transistor as a function of temperature are now dependent solely on the variation of the individual gains with the temperature itself. That variation is of about 0.5%/°C., and therefore, well below the temperature variation of the $I_c(V_{BE})$ which is equal, in the instance of small temperature ranges, to 8%/°C.

However, the known solutions only permit a partial reduction of direct secondary breakdown and are not always devoid of disadvantages. For example, in the instance of ballast resistors being utilized, there occurs an increase in the saturation voltage of the power transistor.

SUMMARY OF THE INVENTION

In view of this situation, the aim of this invention is to provide an integrated semiconductor device which can reduce drastically the occurrence of the direct secondary breakdown phenomena.

Within that aim, it is a particular object of this invention to provide an integrated semiconductor device which can deliver an appreciably higher power with respect to known devices.

Another object of this invention is to provide a said integrated semiconductor device wherein the arrangement of the individual elementary transistors (NPN) and any drive PNP is such that the structure as a whole occupies the same or a slightly larger area than that of traditional structures.

The indicated aim, the outlined objects and others yet which will be apparent hereinafter are achieved by an integrated semiconductor device according to the invention, comprising a plurality of elementary transistors disposed side-by-side to one another and having emitter, base, and collector areas, wherein said emitter areas of said elementary transistors extend adjacent to one another in the related base areas and are physically separated and electrically connected through a common collector contact area, and the collector areas extend adjacent to one another physically separated but electrically connected through a common emitter contact area, in an interleaved fashion with said emitter contact areas, characterized in that every elementary transistor is spaced apart from the adjacent transistors by a distance at least equal to one half the width of an elementary transistor.

BRIEF DESCRIPTION OF THE DRAWINGS

Further features and advantages will be more clearly apparent from the description of preferred but not exclusive embodiments relating to a bipolar power transistor and a class B output stage, indicated by way of illustration and not of limitation in the accompanying drawings, where.

DESCRIPTION OF THE PREFERRED EMBODIMENTS

Figure 1:
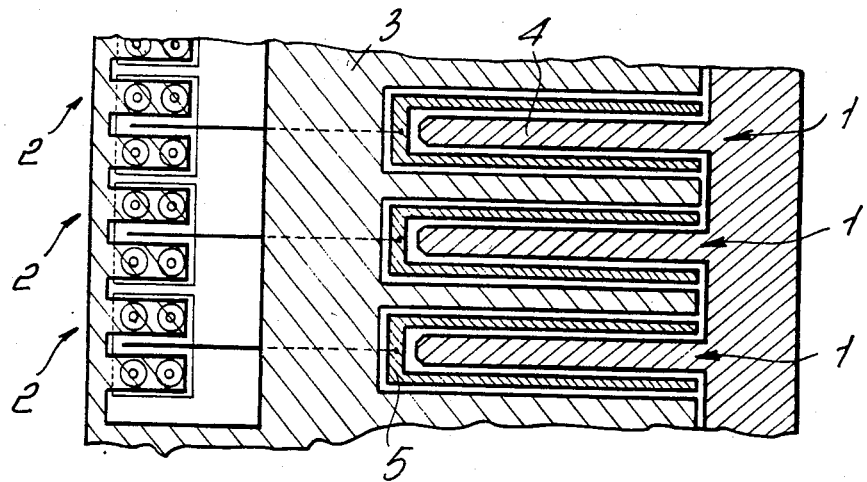
FIG. 1 shows the arrangement of the areas of a known type power transistor, constructed in accordance with Italian Patent application No. 21028 A/84.
Figure 2:
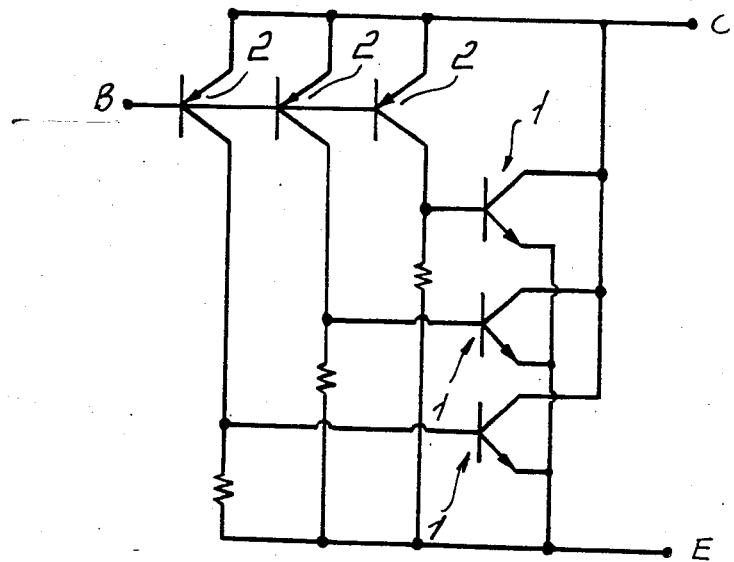
FIG. 2 shows the equivalent electric diagram of the structure of FIG. 1.

FIGS. 1 and 2 show a known diagram relating to a bipolar power transistor. As may be seen, that known transistor is composed of a multiplicity of like elementary transistors, identified with the reference numeral 1, having collectors formed by areas extending parallel and adjacent to one another, connected electrically by the metal 3. Likewise the emitters of the transistors 1 comprise areas extending parallel at a distance and being interleaved with the collector regions, and are connected electrically together by means of the metal layer 4. Between the two metallizations there extends the base metal layer 5 of U-like shape. Owing to that arrangement that structure is called interdigited, each finger whereof (comprising a plurality of cells) forms an elementary transistor. The transistor according to FIGS. 1 and 2 is further composed of a plurality of current sources, formed here by transistors 2. As may be seen in particular in FIG. 2, the bases of the transistors 1 are mutually separated and each connected to a related collector of a current source PNP transistor 2 employing the "crossunder" technique, as known in the art.

Figure 3:
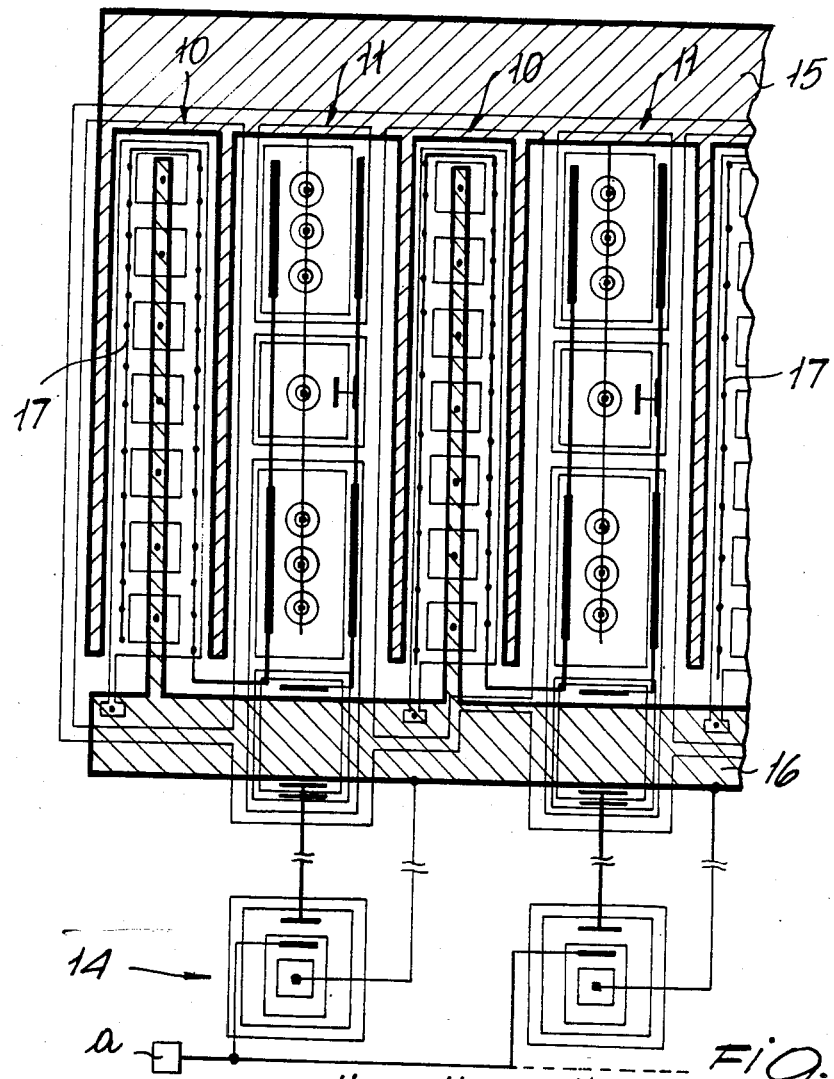
FIG. 3 shows the arrangement of the areas of a bipolar power transistor constructed according to the invention.
Figure 4:
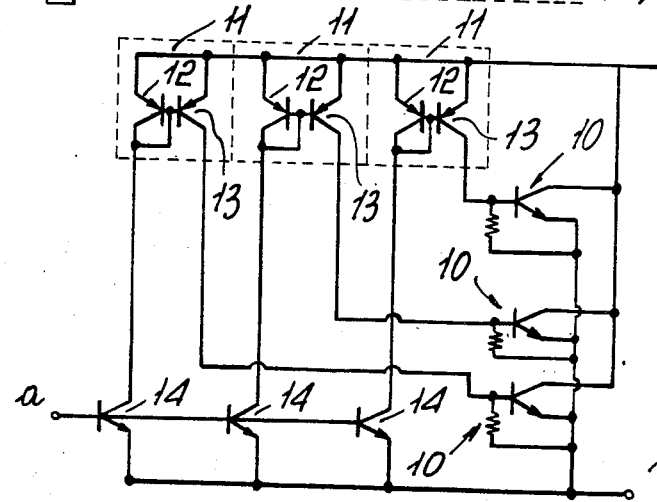
FIG. 4 shows the equivalent electric diagram of the arrangement of FIG. 3.

FIGS. 3 and 4 show instead the bipolar power transistor according to the invention. As may be seen, the structure is again formed of a plurality of NPN transistors 10 (e.g. the circuit of FIG. 4 comprises three such transistors) and related current sources 11 composed here of a current mirror formed by a first transistor 12 diode connected and a second transistor 13. Similarly to the known structure, the base of each of the elementary transistors 10, of the NPN type, is separated from the other bases and is connected to a respective current source 11 consisting of PNP transistors. Such PNP's are in turn current driven through the circuitry shown, composed substantially of the transistors 14, in order to reduce its sensitivity to temperature.

According to the invention and as can be deduced from FIG. 3, the elementary transistors 10 are no longer arranged adjacent to one another but spaced apart from one another (for example by 18 mils (457.2 microns) between the longitudinal symmetry axes of two adjacent transistors) so as to reduce the electrothermal interaction. In practice, in the layout of FIG. 3, with respect to a conventional "interdigited" structure, every two elementary transistors, one has been eliminated to increase the mutual distance between the remaining transistors 10. In order not to waste the area left empty by the absence of the eliminated elementary transistors, this same area has been employed for arranging there the current sources indicated at 11. Consequently, the device as a whole will have an area just greater than that of known devices, reducing, however, to a large extent the thermal interaction between the elementary transistors. The currents delivered from the sources 11 may be rightfully regarded as being equal to one another and unaffected by the temperature variations owing to the particular driving adopted.

In FIG. 3 the collector 15, emitter 16, and base 17 metal layers have been shown in detail; furthermore, in that figure, the electric connections between the different areas forming the transistors 10,12,13 and 14 have been indicated in a partly schematical manner.

In practice, as visible, the power transistor comprises a plurality of elementary transistors 10 and an equal plurality of current source means 11, each elementary transistor including respective emitter, base and collector areas, the emitter, base and collector areas of each elementary transistor defining together an elementary transistor width. As visible, the collector areas of the elementary transistors extend adjacent to one another, are physically separated from each other and electrically connected to each other through a common collector contact area 15 including collector contact portions extending side-by-side to each other in electrical contact with said collector areas, the emitter areas of said elementary transistors extend adjacent to one another, physically separated from each other and electrically connected to each other through a common emitter contact area 16 including emitter contact portions extending side-by-side to each other in electrical contact with the emitter areas and in interleaved fashion with the collector contact portions. The current source means have first mutually independent terminals (connected to the respective transistors 14) and second mutually independent terminals which are individually connected to the base area of the respective elementary transistor for current driving it. As further visible, each elementary transistor is spaced apart from an adjacent elementary transistor by a space which is equal to elementary transistor width and accomodates a current source means.

Figure 5:
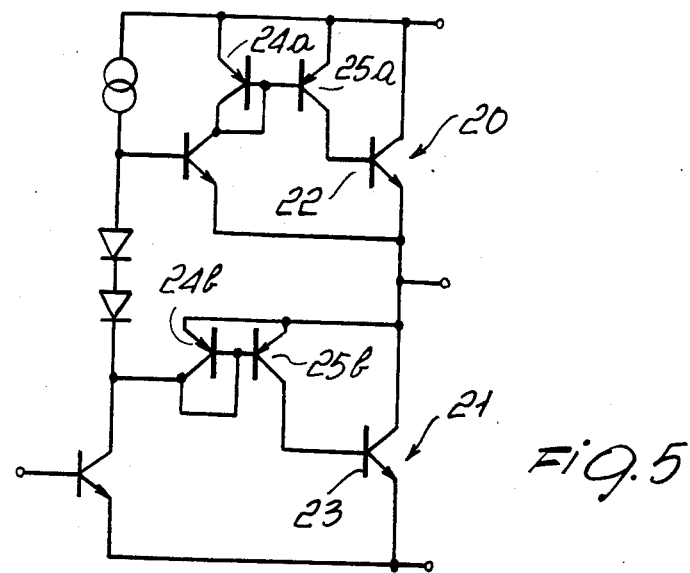
FIG. 5 shows an equivalent diagram of a class B output stage of a known type.

FIG. 5 shows the equivalent electric diagram of a class B output stage of known type. As may be seen, the circuit shown in FIG. 5 has an upper stage 20 and a lower stage 21 each composed of a power transistor 22 and 23, respectively base controlled by a current source composed of the current mirror formed by the transistors 24a and 25a and respectively 24b and 25b.

Figure 6:
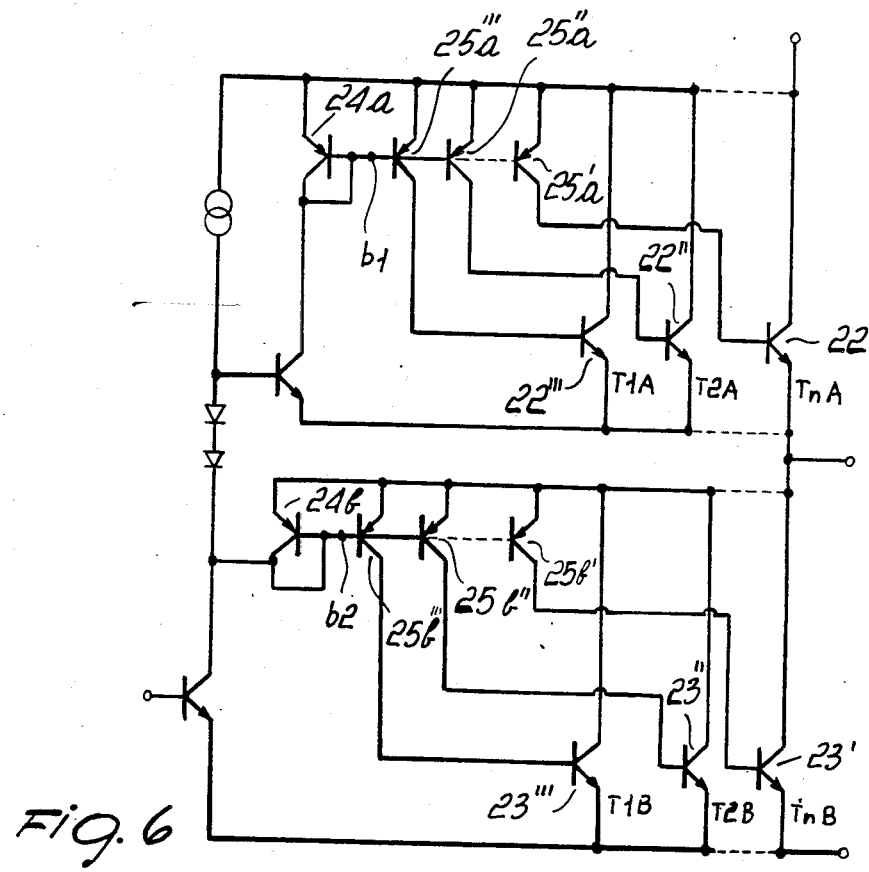
FIG. 6 shows the equivalent electric diagram of a class B output stage, constructed according to Italian patent application No. 21028 A/84.

The circuit of FIG. 6 shows a class B output stage according to the cited Italian patent application No. 21028 A/84 and also valid for the invention. Similarly to the circuit of FIG. 5, the output stage according to FIG. 6 is composed of an upper stage and a lower stage. The upper stage comprises the power transistor formed by a plurality of elementary transistors $22', 22'', 22'''$ . . . base controlled by current sources composed of the transistors PNP $25a', 25a'', 25a'''$ . . . current mirror connected to a PNP transistor 24a. Likewise the lower stage is composed of a power transistor formed by elementary transistors $23', 23'', 23'''$ . . . base controlled by current sources composed of PNP transistors $25b', 25b'', 25b'''$ . . . current mirror connected to the diode connected transistor 24b. Also in this case to recognize the invention concept reference should be had to FIGS. 7 and 8, showing two variations of the area arrangements relating to FIG. 6.

Figures 7, 8:
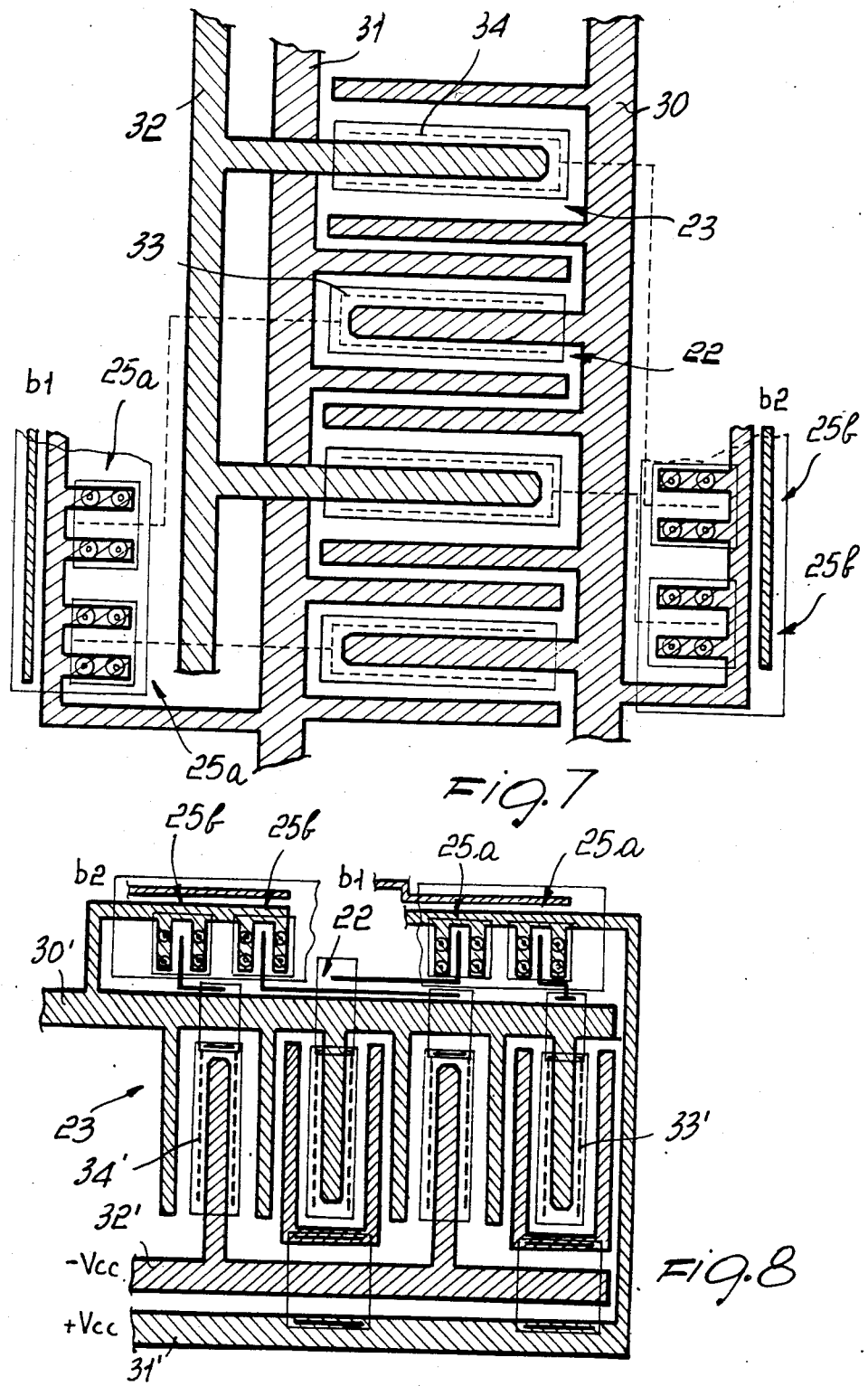
FIGS. 7 and 8 show two possible variations of the area arrangement for implementing the structure shown in FIG. 6, according to this invention.

In FIG. 7 there is shown the arrangement of the areas of the output stage according to the invention, wherein the metallizations have been made by using two metal layers, whereas in FIG. 8 there is an arrangement with a single metal layer. In particular FIGS. 7 and 8 the elementary transistors 23 relating to the lower stage or portion of the circuit of FIG. 6, and the transistors 22 relating to the upper stage or portion of FIG. 6 are shown. As may be seen, the elementary transistors 22 of the circuit upper portion are arranged alternatively interleaved with the elementary transistors 23 relating to the circuit lower portion. In practice even in this case for each of the power transistors of the upper or lower stage, one elementary transistor every two has been eliminated. Furthermore, the individual elementary transistors or fingers of the two power transistors have been interleaved so as to recover the lost area owing to the elimination of the elementary transistors. In this arrangement, the drive transistors PNP have been arranged in the usual manner adjacent to the respective power transistors. In the embodiment of FIG. 7, where the metallizations have been made by using two metal layers, the current sources 25a relating to the upper stage and the current sources 25b relating to the lower stage are arranged on two opposed sides of the area occupied by the power transistors, while in FIG. 8 the current sources 25a and 25b have been both arranged on the same side and are suitably connected to the respective elementary transistors.

Furthermore and in detail in FIGS. 7 and 8 reference numerals 30 and 30' indicate the metal layers of the emitters of the elementary transistors 22 of the upper stage and of the collectors of the elementary transistors 23 of the lower stage, 31 and 31' the metal layers of the collectors of the elementary transistors 22 of the upper stage, and 32 and 32' the metal layers of the emitters of the elementary transistors 23 of the lower stage.

In these FIGS. 7 and 8 reference numerals 33 and 33' indicate the base connections of the elementary transistors 22 of the upper stage and collector ones of the current sources 25a and 34 and 34' the base connections of the elementary transistors 23 of the lower stage and the collector ones of the current sources 25b of the lower stage.

As visible, the class B output stage comprises a plurality of elementary transistors 22, 23 and an equal plurality of current source means 24a, 24b. The plurality of elementary transistors includes a first group of elementary transistors 22 forming a first power transistor and a second group of elementary transistors 23 forming a second power transistor, each elementary transistor including respective emitter, base and collector areas, wherein the emitter, base and collector areas of each elementary transistor define together an elementary transistor width. As visible, the collector areas of the elementary transistors 22 of the first power transistor extend adjacent to one another, are physically separated from each other and electrically connected to each other through a first common collector contact area 31, 31' including first collector contact portions extending side-by-side to each other in electrical contact with the collector areas of the elementary transistors 22 of the first power transistor, the emitter areas of the elementary transistors of the first power transistor extend adjacent to one another, physically separated from each other and electrically connected to each other through a first common emitter contact area 30, 30' including first emitter contact portions extending side-by-side to each other in electrical contact with the emitter areas of the elementary transistors of the the first power transistor and in interleaved fashion with the first collector contact portions, the collector areas of the elementary transistors 23 of the second power transistor extend adjacent to one another, are physically separated from each other and electrically connected to each other through a second common collector contact area 30, 30' including second collector contact portions extending side-by-side to each other in electrical contact with the collector areas of the elementary transistors of the second power transistor, the emitter areas of the elementary transistors 23 of the second power transistor extend adjacent to one another, physically separated from each other and electrically connected to each other through a second common emitter contact area 32, 32' including second emitter contact portions extending side-by-side to each other in electrical contact with the emitter areas of the elementary transistors of the second power transistor and in interleaved fashion with the second collector contact portions. As further visible, the current source means 24a, 25a, 24b, 25b are singularly provided and have mutually independent terminals, each of which is individually connected to the base area of a respective elementary transistor for independently current driving it. Furthermore, each elementary transistor of the first power transistor is spaced apart from the elementary transistors of the first power transistor which is adjacent thereto by a distance equal to the elementary transistor width and each elementary transistor of the second power transistor is disposed between two adjacent elementary transistors of the first power transistor in the distance included therebetween.

By virtue of the arrangement selected it is possible to utilize the advantages afforded by the use of the solution indicated in the cited Italian Patent application No. 21028 A/84 together with those afforded by spacing by a given extent the individual fingers or base areas of each power transistor making up the output stage. The interleaved arrangement of the elementary transistors composing the power transistors allows the device size to be reduced to a minimum, and the device as a whole will have an area approximately equal to that of known devices.

The devices according to the invention operate in a similar manner to those according to the prior art, with the important advantage of a drastic reduction in the thermal interaction between the elementary transistors. In practice with the devices according to the invention the power delivered by each power transistor is equal to the sum of the powers delivered by each elementary transistor or finger of the structure. As an example, in the event that a bipolar power transistor is constructed, if the power levels p of the individual elementary transistors forming the power transistor are limited by the direct secondary breakdown phenomenon to a given value, e.g. $V_{CE} \cdot i_{s/b}$ ($i_{s/b}$ being the collector current level at which, for a given collector-emitter voltage $V_{CE}$, there occurs failure of the elementary transistor), the power transistor according to the invention, as a whole, is able to deliver a power $P = V_{CE} \cdot N \cdot i_{s/b}$, N being the number of the elementary transistors forming the power transistor itself. Likewise in the case where a class B output stage is constructed, each of the two power transistors forming the output stage is able to deliver a power equal to the sum of the powers delivered by the individual elementary transistors forming every power transistor. In addition, the saturation voltage undergoes no alterations.

A further advantage concerns the possible simplification or elimination of the circuitries normally employed in integrated circuits for overload protection. Said circuitries have in fact the purpose of preventing the power transistor from finding itself in a condition of excessive dissipation (SOA safe operating area). By broadening the safety area, according to the invention, it is possible to reduce or eliminate such circuitries.

In the instance of the class B output stage, the connections may be made on a single metal layer by means of a suitable crossunders or by using two metal layers thus avoiding crossing in the connections.

The invention herein is susceptible to many modifications and variations, without departing from the scope of the inventive concept.

Furthermore, all the elements may be replaced with technical equivalents thereof.

We claim:

1. An integrated semiconductor device, comprising a plurality of elementary transistors arranged side-by-side and an equal plurality of current source means, each elementary transistor including respective emitter, base and collector areas defining together an elementary transistor width, said collector areas of said elementary transistors extending adjacent to one another, being physically separated from each other and electrically connected to each other through a common collector contact area including collector contact portions extending side-by-side to each other in electrical contact with said collector areas, said emitter areas of said elementary transistors extending adjacent to one another, physically separated from each other and electrically connected to each other through a common emitter contact area including emitter contact portions extending side-by-side to each other in electrical contact with said emitter areas and in interleaved fashion with said collector contact portions, each said current source means having at least one terminal individually connected to said base area of a respective one of said plurality of elementary transistors for current driving said respective one of said elementary transistor, each said elementary transistor being spaced apart from an adjacent elementary transistor by a space which is at least equal to one half said elementary transistor width.

2. A device according to claim 1, wherein said space is equal to said elementary transistor width.

3. A device according to claim 1, wherein said space is equal to said elementary transistor width and said plurality of elementary transistor forms a power transistor, each said current source means being disposed between two adjacent elementary transistors in said space included therebetween.

4. A device according to claim 1, wherein said plurality of elementary transistor forms a class B output stage including a first group of said elementary transistors forming a first power transistor and a second group of said elementary transistors forming a second power transistor, each said elementary transistors of said first power transistor being spaced apart from the elementary transistors of said first power transistor which is adjacent thereto by a distance equal to said elementary transistor width, and each said elementary transistor of said second power transistor is disposed between two adjacent elementary transistors of said first power transistor in said distance included therebetween.

5. A device according to claim 4, wherein said plurality of elementary transistors have emitter, base and collector areas respectively electrically connected through respective emitter, base and collector contact areas formed on a single metal layer.

6. A device according to claim 4, wherein said plurality of elementary transistors have emitter, base and collector areas respectively electrically connected through respective emitter, base and collector contact areas formed on two metal layers.

7. An integrated semiconductor device, comprising a plurality of elementary transistors and an equal plurality of separate current source means forming a power transistor, each elementary transistor including respective emitter, base and collector areas, said emitter, base and collector areas of each elementary transistor defining together an elementary transistor width, said collector areas of said elementary transistors extending adjacent to one another, being physically separated from each other and electrically connected to each other through a common collector contact area including collector contact portions extending side-by-side to each other in electrical contact with said collector areas, said emitter areas of said elementary transistors extending adjacent to one another, physically separated from each other and electrically connected to each other through a common emitter contact area including emitter contact portions extending side-by-side to each other in electrical contact with said emitter areas and in interleaved fashion with said collector contact portions, said current source means being independent from each other and having mutually independent terminals, each said terminal of said current source means being individually connected to said base area of a respective one of said plurality of elementary transistors for current driving said respective one of said elementary transistors, each said elementary transistor being spaced apart from an adjacent elementary transistor by a space which is equal to said elementary transistor width, each said current source means being disposed between two adjacent elementary transistors in said space included therebetween.

8. An integrated semiconductor device, comprising a plurality of elementary transistors and an equal plurality of separate current source means, said plurality of elementary transistor forming a class B output stage including a first group of said elementary transistors forming a first power transistor and a second group of said elementary transistors forming a second power transistor, each elementary transistor including respective emitter, base and collector areas, said emitter, base and collector areas of each elementary transistor defining together an elementary transistor width, said collector areas of said elementary transistors of said first power transistor extending adjacent to one another, being physically separated from each other and electrically connected to each other through a first common collector contact area including first collector contact portions extending side-by-side to each other in electrical contact with said collector areas of said elementary transistors of said first power transistor, said emitter areas of said elementary transistors of said first power transistor extending adjacent to one another, physically separated from each other and electrically connected to each other through a first common emitter contact area including first emitter contact portions extending side-by-side to each other in electrical contact with said emitter areas of said elementary transistors of said first power transistor and in interleaved fashion with said first collector contact portions, said collector areas of said elementary transistors of said second power transistor extending adjacent to one another, being physically separated from each other and electrically connected to each other through a second common collector contact area including second collector contact portions extending side-by-side to each other in electrical contact with said collector areas of said elementary transistors of said second power transistor, said emitter areas of said elementary transistors of said second power transistor extending adjacent to one another, physically separated from each other and electrically connected to each other through a second common emitter contact area including second emitter contact portions extending side-by-side to each other in electrical contact with said emitter areas of said elementary transistors of said second power transistor and in interleaved fashion with said second collector contact portions, said current source means having mutually independent terminals, each said terminal of said current source means being individually connected to said base area of a respective one of said plurality of elementary transistors for independently current driving said respective one of said elementary transistors, each said elementary transistor of said first power transistor being spaced apart from the elementary transistor of said first power transistor which is adjacent thereto by a distance equal to said elementary transistor width, and each said elementary transistor of said second power transistor being disposed between two adjacent elementary transistors of said first power transistor in said distance included therebetween.

* * * * *